United States Patent
Lin et al.

(10) Patent No.: US 9,159,450 B2
(45) Date of Patent: Oct. 13, 2015

(54) SAMPLING CIRCUIT FOR MEASURING REFLECTED VOLTAGE OF TRANSFORMER FOR POWER CONVERTER OPERATED IN DCM AND CCM

(71) Applicant: SYSTEM GENERAL CORP., Taipei Hsien (TW)

(72) Inventors: Li Lin, Taipei (TW); Yue-Hong Tang, Nantou County (TW); Chin-Yen Lin, Hsinchu County (TW); Jung-Sheng Chen, Kaohsiung (TW); Ta-Yung Yang, Milpitas, CA (US)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 13/847,567

(22) Filed: Mar. 20, 2013

(65) Prior Publication Data

US 2013/0249601 A1    Sep. 26, 2013

Related U.S. Application Data

(60) Provisional application No. 61/613,555, filed on Mar. 21, 2012.

(51) Int. Cl.
*G11C 27/02* (2006.01)
*H03K 5/00* (2006.01)
*H02M 3/335* (2006.01)

(52) U.S. Cl.
CPC .............. *G11C 27/02* (2013.01); *G11C 27/026* (2013.01); *H02M 3/33523* (2013.01)

(58) Field of Classification Search
CPC ..... G11C 27/02; G11C 27/024; G11C 27/026
USPC .............................. 327/94, 95; 363/21.15, 21
See application file for complete search history.

(56) References Cited

U.S. PATENT DOCUMENTS

| | | | | |
|---|---|---|---|---|
| 6,853,563 | B1 * | 2/2005 | Yang et al. | 363/21.15 |
| 6,862,194 | B2 * | 3/2005 | Yang et al. | 363/16 |
| 7,016,204 | B2 * | 3/2006 | Yang et al. | 363/21.13 |
| 7,151,681 | B2 | 12/2006 | Yang et al. | |
| 7,349,229 | B1 | 3/2008 | Yang | |
| 7,352,595 | B2 | 4/2008 | Yang et al. | |
| 7,486,528 | B2 | 2/2009 | Yang | |

* cited by examiner

*Primary Examiner* — Kenneth B Wells
(74) *Attorney, Agent, or Firm* — Rosenberg, Klein & Lee

(57) ABSTRACT

A sampling circuit of the power converter according to the present invention comprises an amplifier circuit receiving a reflected voltage for generating a first signal. A first switch and a first capacitor are utilized to generate a second signal in response to the reflected voltage. A sample-signal circuit generates a sample signal in response to the disable of a switching signal. The switching signal is generated in accordance with a feedback signal for regulating an output of the power converter. The feedback signal is generated in accordance with the second signal. The sample signal is utilized to control the first switch for sampling the reflected voltage. The sample signal is disabled once the first signal is lower than the second signal. The sampling circuit precisely samples the reflected voltage of the transformer of the power converter for regulating the output of the power converter.

19 Claims, 7 Drawing Sheets

US 9,159,450 B2

SAMPLING CIRCUIT FOR MEASURING REFLECTED VOLTAGE OF TRANSFORMER FOR POWER CONVERTER OPERATED IN DCM AND CCM

BACKGROUND OF THE INVENTION

1. Filed of Invention

The present invention relates to a power converter, and more particularly, the present invention relates to a sampling circuit of the power converter.

2. Description of Related Art

The reflected voltage is utilized to generate a feedback signal for regulating an output of the power converter. The feedback signal is correlated to the output of the power converter. Many prior arts had been disclosed for the detection of the reflected voltage of the transformer, such as "Multiple-sampling circuit for measuring reflected voltage and discharge time of a transformer" U.S. Pat. No. 7,151,681; "Causal sampling circuit for measuring reflected voltage and demagnetizing time of transformer" U.S. Pat. No. 7,349,229; and "Linear-predict sampling for measuring demagnetized voltage of transformer" U.S. Pat. No. 7,486,528. However, the complexity is the drawback of the U.S. Pat. No. 7,151,681. The disadvantage of the U.S. Pat. No. 7,349,229 is the imprecise sampling in response to the dynamic loading or the input-voltage change. The approach of the U.S. Pat. No. 7,486,528 is limited by the turn ratio of the transformer design. The present invention provides a simple and precise method to sample the reflected voltage of the transformer for the power converter operated in DCM (discontinuous current mode) and CCM (continuous current mode).

BRIEF SUMMARY OF THE INVENTION

The object of the present invention is to provide a precise sampling circuit for measuring the reflected voltage of the transformer of the power converter.

The present invention provides a sampling circuit for sampling a reflected voltage of a transformer for the power converter. The sampling circuit comprises an amplifier circuit, a first capacitor, a first switch, and a sample-signal circuit. The amplifier circuit is coupled to receive the reflected voltage for generating a first signal. The first capacitor generates a second signal in response to the reflected voltage. The first switch is coupled between the reflected voltage and the first capacitor. The sample-signal circuit generates a sample signal in response to the disable of a switching signal. The switching signal is generated in accordance with a feedback signal for regulating an output of the power converter. The feedback signal is generated in accordance with the second signal. The sample signal is utilized to control the first switch for sampling the reflected voltage. The sample signal is disabled once the first signal is lower than the second signal. The second signal comparing with the first signal has a propagation delay.

The present invention provides another sampling circuit of the power converter. The sampling circuit comprises an amplifier circuit and a sample unit. The amplifier circuit generates a first signal in response to a reflected voltage of a transformer of the power converter. The sample unit samples the reflected voltage for generating a second signal in response to the disable of a switching signal. The switching signal is generated in accordance with a feedback signal for regulating an output of the power converter. The feedback signal is generated in accordance with the second signal. Further, the sample unit stops sampling the reflected voltage once the first signal is lower than the second signal or/and a pulse signal is enabled, the pulse signal is utilized to generate the switching signal.

BRIEF DESCRIPTION OF ACCOMPANIED DRAWINGS

The accompanying drawings are included to provide further understanding of the invention, and are incorporated into and constitute a part of this specification. The drawings illustrate embodiments of the invention and, together with the description, serve to explain the principles of the invention.

DETAILED DESCRIPTION OF EMBODIMENTS

Figure 1:
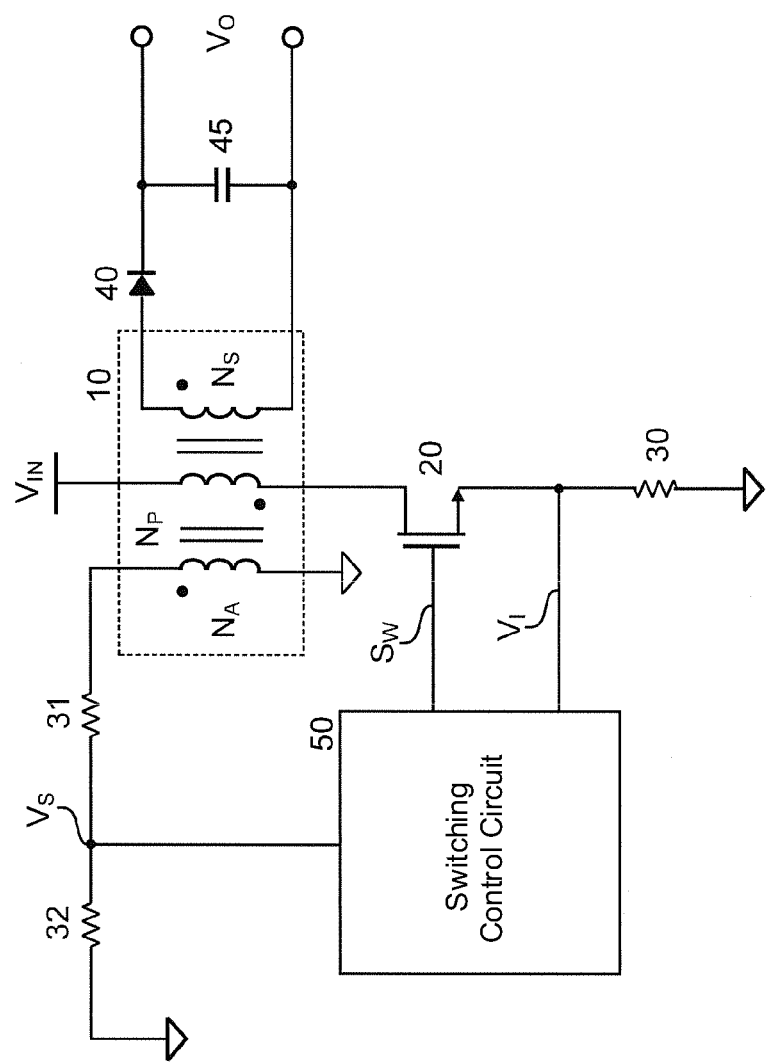
FIG. 1 shows a circuit diagram of an embodiment of a switching power converter in accordance with the present invention.

FIG. 1 shows a circuit diagram of an embodiment of a switching power converter in accordance with the present invention. The switching power converter comprises a transformer 10 having an auxiliary winding $N_A$, a primary winding $N_P$, and a secondary winding $N_S$. A terminal of the primary winding $N_P$ is coupled to an input voltage $V_{IN}$. The secondary winding $N_S$ generates an output voltage $V_O$ via a rectifier 40 and a capacitor 45. In order to regulate the output voltage $V_O$, a switching control circuit 50 generates a switching signal $S_W$ to switch the transformer 10 via a transistor 20. The transistor 20 is coupled to the other terminal of the primary winding $N_P$ of the transformer 10. The transistor 20 serves as a power switch. When the transistor 20 is turned on, a magnetized voltage (the input voltage $V_{IN}$) is applied to the transformer 10. A charge current is therefore flowed through the primary winding $N_P$ of the transformer 10 and the transistor 20.

Through a resistor 30 coupled between the transistor 20 and the ground, the charge current is converted to a current signal $V_I$ coupled to the switching control circuit 50. The energy stored into the transformer 10 during the magnetized period is delivered to the secondary winding $N_S$ and the auxiliary winding $N_A$ of the transformer 10 once the transistor 20 is turned off. If the forward voltage of the rectifier 40 can be neglected, a reflected voltage $V_{AUX}$ of the auxiliary winding $N_A$ can be expressed as, $$V_{AUX} = \frac{N_A}{N_S} \times V_O \quad (1)$$

where $N_A$ and $N_S$ are respectively the winding turns of the auxiliary winding $N_A$ and the secondary winding $N_S$ of the transformer 10. According to the equation (1), the reflected voltage $V_{AUX}$ represents the output voltage $V_O$ of the power converter.

A voltage divider formed by resistors 31 and 32 generates a signal $V_S$ in accordance with the reflected voltage $V_{AUX}$. It can be shown as, $$V_S = \frac{R_{32}}{R_{31} + R_{32}} \times V_{AUX} \quad (2)$$

where $R_{31}$ and $R_{32}$ are respectively the resistance of the resistors 31 and 32. The signal $V_S$ represents the reflected voltage $V_{AUX}$.

In order to precisely detect the output voltage $V_o$ of the power converter, the reflected voltage should be measured when the switching current of the secondary winding $N_s$ is close to the zero. Therefore, the variation of the forward voltage of the rectifier 40 can be neglected. The charge current flows through the transformer 10 when the magnetized voltage (the input voltage $V_{IN}$) is applied to the transformer 10. A discharge current is produced according to the reflected voltage (the output voltage $V_O$) across the secondary winding $N_s$ of the transformer 10 during the demagnetized time. The discharge current represents the switching current of the secondary winding $N_s$ of the transformer 10. It will reduce to zero at the end of the demagnetized time. Therefore, the reflected voltage of the transformer 10 should be sampled right before the end of the demagnetized time. It indicates that the reflected voltage is sampled before the transformer 10 is fully demagnetized.

$$I_C = \frac{V_{IN}}{L_P} \times T_{CHARGE} \quad (3)$$

$$I_D = \frac{V_O}{L_S} \times T_{DISCHARGE} \quad (4)$$

where $I_C$ is the charge current; $I_D$ is the discharge current; $L_P$ and $L_S$ are inductances of the primary winding $N_P$ and secondary winding $N_S$ of the transformer 10, respectively. $T_{CHARGE}$ is the magnetized time; $T_{DISCHARGE}$ is the demagnetized time. For the CCM operation, the reflected voltage must be sampled before the end of the demagnetized time (before the discharge current reduces to zero), the forward voltage of the rectifier 40 cannot be neglected. The sampled reflected voltage that is affected by the forward voltage of the rectifier 40 can be compensated by the method shown in "Primary-side controlled switching regulator" U.S. Pat. No. 7,352,595.

Figure 2:
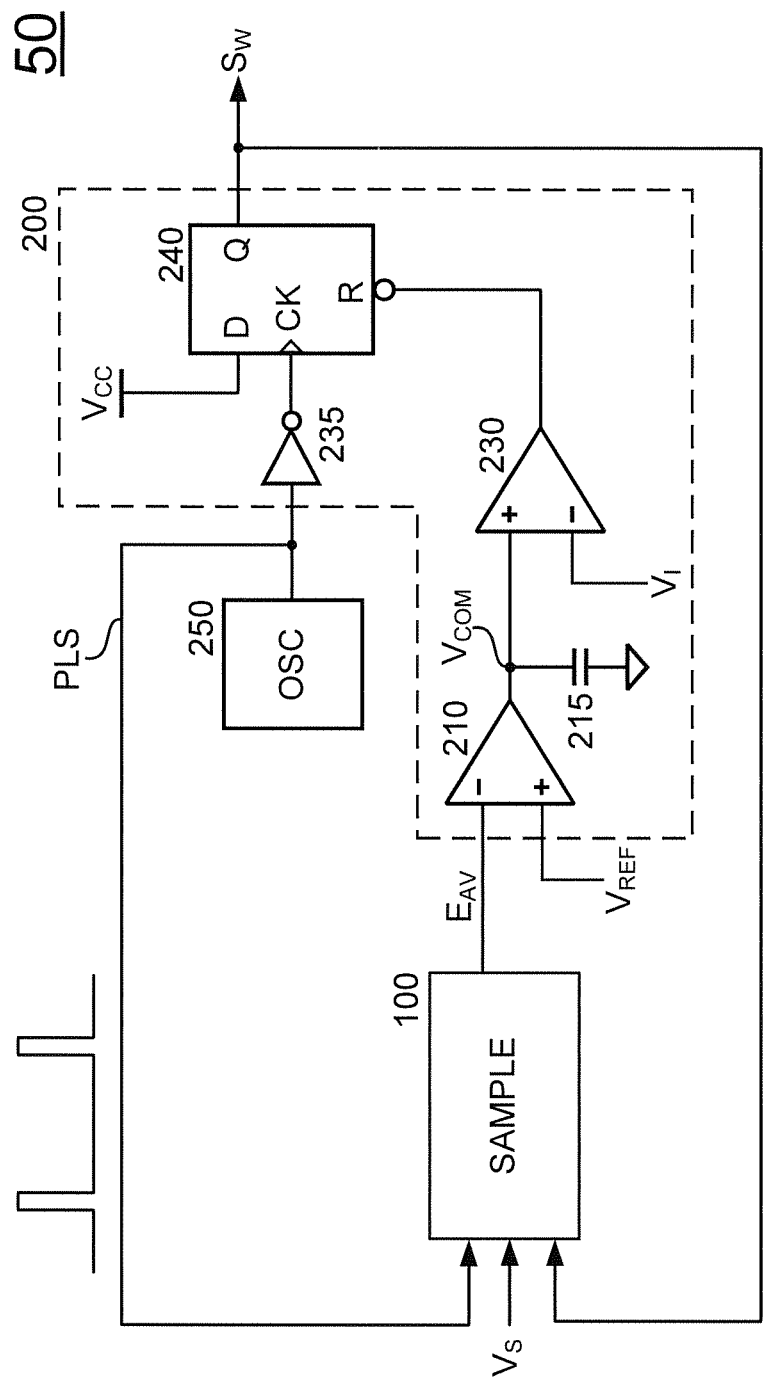
FIG. 2 is a circuit diagram of an embodiment of a switching control circuit in accordance with the present invention.

FIG. 2 is a circuit diagram of an embodiment of the switching control circuit 50 in accordance with the present invention. It includes a sample circuit (SAMPLE) 100 and a PWM circuit (PWM) 200. The sample circuit 100 receives the signal $V_S$, a pulse signal PLS and the switching signal $S_W$ for generating a feedback signal $E_{AV}$ in accordance with the reflected voltage (signal $V_S$) of the transformer 10, the pulse signal PLS, and the switching signal $S_W$.

A trans-conductance amplifier 210, a frequency compensation capacitor 215, a comparator 230, an inverter 235 and a flip-flop 240 develop the PWM circuit 200 for generating the switching signal $S_W$. The trans-conductance amplifier 210 having a reference signal $V_{REF}$ compares to the feedback signal $E_{AV}$ for generating a signal $V_{COM}$. The reference signal $V_{REF}$ is supplied with a positive input terminal of the trans-conductance amplifier 210. A negative input terminal of the trans-conductance amplifier 210 is coupled to receive the feedback signal $E_{AV}$. An output terminal of the trans-conductance amplifier 210 generates the signal $V_{COM}$.

The frequency compensation capacitor 215 is coupled to the signal $V_{COM}$ for the feedback loop compensation. The signal $V_{COM}$ is further coupled to a positive input terminal of the comparator 230 to reset the flip-flop 240 when the current signal $V_1$ is higher than the signal $V_{COM}$. The current signal $V_1$ is supplied to a negative input terminal of the comparator 230. An output terminal of the comparator 230 is coupled to a reset input terminal R of the flip-flop 240. A supply voltage $V_{CC}$ is supplied to an input terminal D of the flip-flop 240. An oscillator (OSC) 250 generates the pulse signal PLS coupled to a clock input terminal CK of the flip-flop 240 via the inverter 235 to enable the flip-flop 240 and the switching signal $S_W$ outputted by an output terminal Q of the flip-flop 240. The feedback signal $E_{AV}$ and the current signal $V_1$ are coupled to the PWM circuit 200 to control the flip-flop 240 and the switching signal $S_W$ for regulating the output of the power converter.

Figure 3:
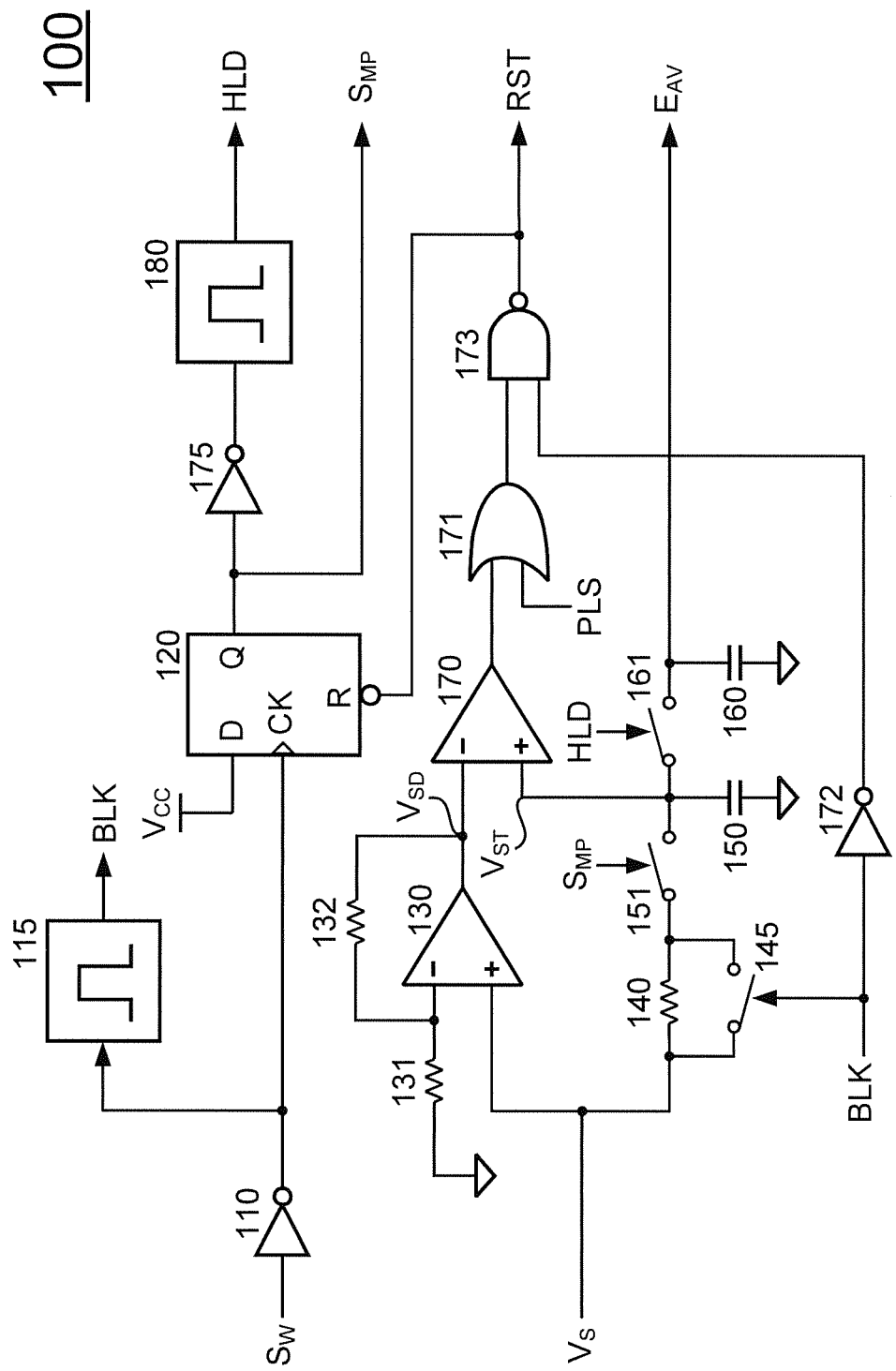
FIG. 3 is a circuit diagram of an embodiment of a sample circuit in accordance with the present invention.

FIG. 3 is a circuit diagram of an embodiment of the sample circuit 100 in accordance with the present invention. The sample circuit 100 comprises an amplifier circuit including an amplifier 130, resistors 131 and 132. The amplifier circuit receives the signal $V_S$ for generating a first signal $V_{SD}$. In other words, the amplifier circuit receives the reflected voltage for generating the first signal $V_{SD}$. The signal $V_S$ is coupled to a positive input terminal of the amplifier 130 to generate the first signal $V_{SD}$. The first signal $V_{SD}$) is amplified by the amplifier circuit in accordance with the signal $V_S$ (the reflected voltage). The resistor 131 is coupled between the ground and a negative input terminal of the amplifier 130. The resistor 132 is coupled between the negative input terminal of the amplifier 130 and an output terminal of the amplifier 130.

Figure 5A:
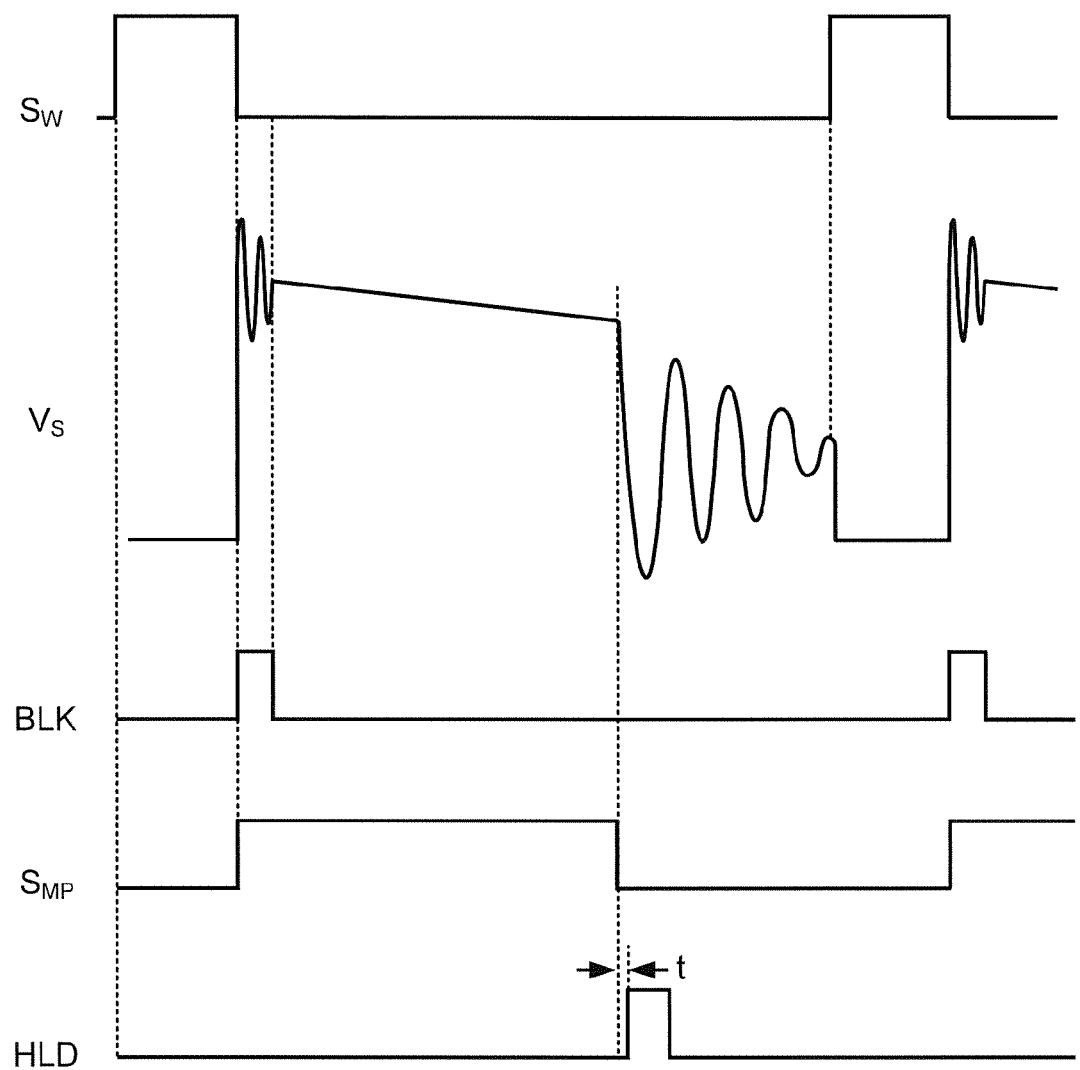
FIG. 5A shows the signal waveforms of the switching signal $S_W$, the signal $V_S$, the blanking signal BLK, the sample signal $S_{MP}$, and the hold signal HLD for the power converter operated in DCM in accordance with the present invention.

The sample circuit 100 further comprises a sample unit including a first capacitor 150 and a first switch 151 for sampling the signal $V_S$ and generating a second signal $V_{ST}$. That is, the sample unit is utilized to sample the reflected voltage of the transformer 10 (as shown in FIG. 1). The first capacitor 150 is utilized to sample the signal $V_S$ through a resistive device 140 and the first switch 151. The resistive device 140 is coupled between the auxiliary winding $N_A$ (as shown in FIG. 1) of the transformer 10 and a first terminal of the first switch 151. The first capacitor 150 is coupled between a second terminal of the first switch 151 and the ground. The resistive device 140 and the first capacitor 150 develop a low-pass filter with a propagation delay. A third switch 145 is parallel coupled to the resistive device 140 to reduce the resistance of the resistive device 140 when the third switch 145 is turned on. A blanking signal BLK controls the third switch 145. A sample signal $S_{MP}$ controls the first switch 151 for sampling the signal $V_S$ (the reflected voltage). As shown in FIG. 5A, both the blanking signal BLK and the sample signal $S_{MP}$ are generated in response to the disable of the switching signal $S_W$.

The switching signal $S_W$ generates the blanking signal BLK via a blanking circuit including a pulse generator 115 and an inverter 110. An input terminal of the inverter 110 receives the switching signal $S_W$. An output terminal of the inverter 110 is coupled to an input terminal of the pulse generator 115 for generating the blanking signal BLK. The blanking signal BLK is a pulse signal providing a blanking time (blanking period) and a minimum period for sampling the signal $V_S$ (the reflected voltage of the transformer 10).

The sample circuit 100 further comprises a sample-signal circuit including the inverter 110 and a flip-flop 120 for generating the sample signal $S_{MP}$ in response to the disable of the switching signal $S_W$. The switching signal $S_W$ is coupled to a clock input terminal CK of the flip-flop 120 through the inverter 110. An input terminal D of the flip-flop 120 is coupled to receive the supply voltage $V_{CC}$. An output terminal Q of the flip-flop 120 outputs the sample signal $S_{MP}$. Through the inverter 110 and the flip-flop 120, the switching signal $S_W$ generates (enables) the sample signal $S_{MP}$.

Figure 4:
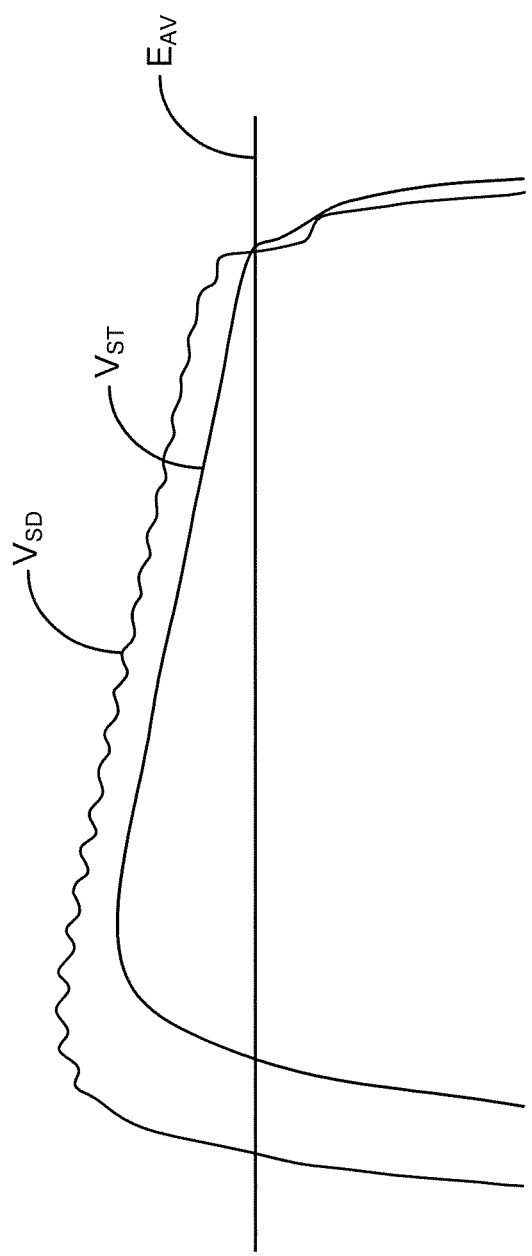
FIG. 4 shows the signal waveforms of the signals $V_{SD}$, $V_{ST}$, and the feedback signal $E_{AV}$ of the sample circuit in accordance with the present invention.

The first capacitor 150 thus generates the second signal $V_{ST}$ in accordance with the signal $V_S$. The second signal $V_{ST}$ is the same as the signal $V_S$ during the blanking period because the third switch 145 and the first switch 151 are turned on. After the blanking period, the first switch 151 may be still turned on, the resistance device 140 provides the low-pass filtering and the propagation delay between the signal $V_S$ and the second signal $V_{ST}$. As shown in FIG. 4, comparing with the first signal $V_{SD}$, the second signal $V_{ST}$ has the propagation delay.

The second signal $V_{ST}$ and the first signal $V_{SD}$ are coupled to a comparator 170 to generate a reset signal RST through an OR gate 171 and an NAND gate 173. The second signal $V_{ST}$ is supplied to a positive input terminal of the comparator 170. A negative input terminal of the comparator 170 is coupled to receive the first signal $V_{SD}$. An output terminal of the comparator 170 is coupled to a first input terminal of the OR gate 171. An output terminal of the OR gate 171 is coupled to an input terminal of the NAND gate 173 to generate the reset signal RST. The reset signal RST is connected to a reset input terminal R of the flip-flop 120 to reset the flip-flop 120 for disabling the sample signal $S_{MP}$.

Figure 5B:
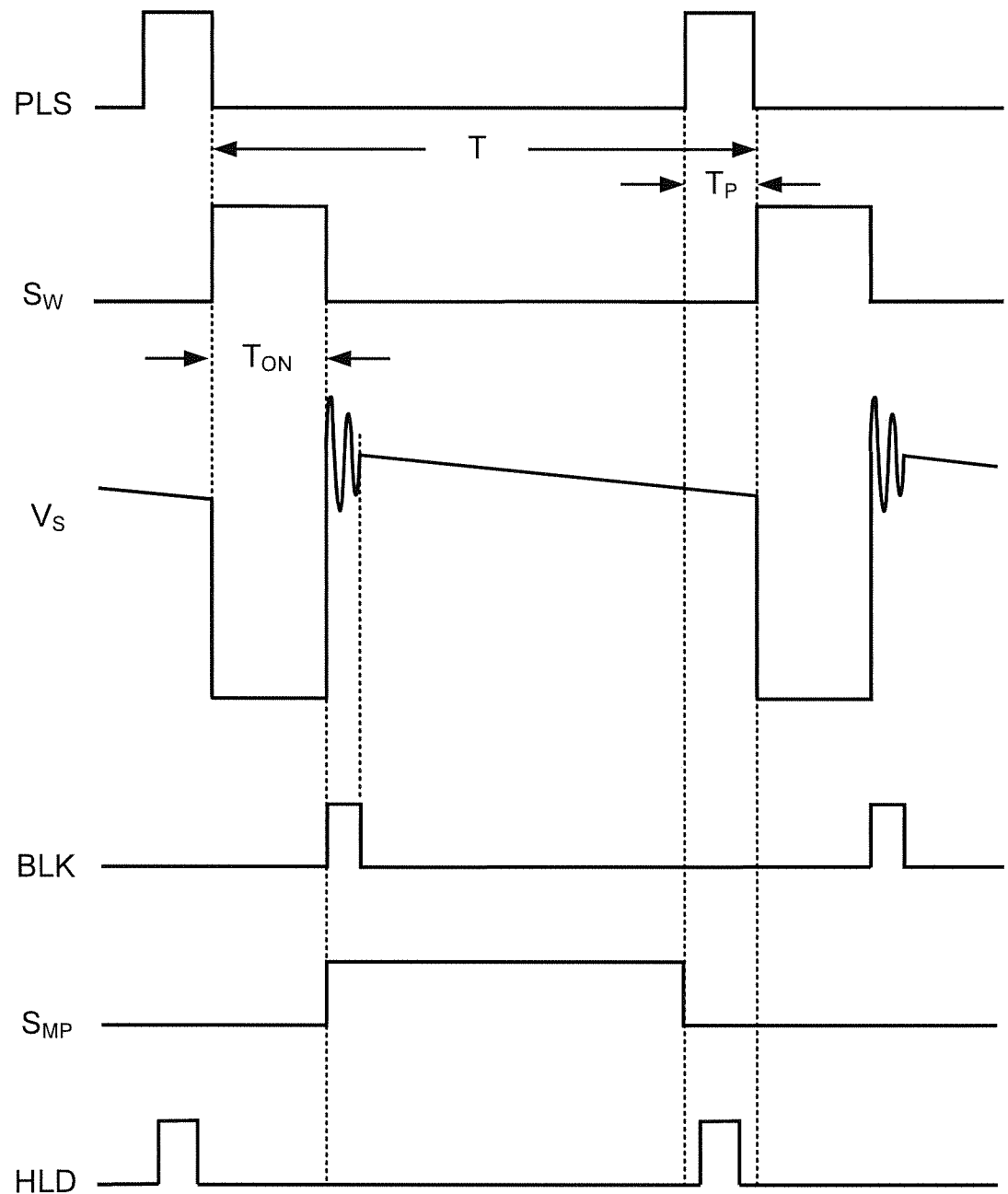
FIG. 5B shows the signal waveforms of the pulse signal PLS, the switching signal $S_W$, the signal $V_S$, the blanking signal BLK, the sample signal $S_{MP}$, and the hold signal HLD for the power converter operated in CCM in accordance with the present invention.

A second input terminal of the OR gate 171 is connected to the pulse signal PLS. Therefore, as shown in FIG. 5B, the sample signal $S_{MP}$ will be ended in response to the enable of the pulse signal PLS, which will ensure the signal $V_S$ (the reflected voltage of the transformer 10) is properly sampled before the start of the next switching cycle of the transformer 10 when the power converter is operated in CCM. Another input terminal of the NAND gate 173 is coupled to receive the blanking signal BLK via an inverter 172. Thus, the reset signal RST is disabled (logic-high level) during the blanking period, which ensures a minimum sample time for sampling the signal $V_S$ and the sample signal $S_{MP}$ having a minimum pulse width in response to the disable of the switching signal $S_W$. In other words, the blanking period (blanking time) provides the minimum pulse width of the sample signal $S_{MP}$.

As shown in FIG. 5A, the sample signal $S_{MP}$ is enabled in response to the disable of the switching signal $S_W$. As shown in FIG. 5B, the sample signal $S_{MP}$ is disabled (the first switch 151 is turned off) once the pulse signal PLS is generated (enabled) and/or the first signal $V_{SD}$ is lower than the second signal $V_{ST}$ (as shown in FIG. 4). It means that the sample unit stops sampling the reflected voltage once the pulse signal PLS is enabled and/or the first signal $V_{SD}$ is lower than the second signal $V_{ST}$. The first signal $V_{SD}$ being lower than the second signal $V_{ST}$ means it is at the end of the demagnetized time. Because the second signal $V_{ST}$ comparing with the signal $V_S$ has the propagation delay, the sampled value at the first capacitor 150 will be the same as the value of the signal $V_S$ right before the end of the demagnetized time. Therefore, the time constant (the propagation delay) of the resistive device 140 and the first capacitor 150 must be longer than a falling edge slew-rate of the first signal $V_{SD}$.

As shown in FIG. 5A, when the sample signal $S_{MP}$ is disabled, the sample signal $S_{MP}$ will generate a hold signal HLD via an inverter 175 and a pulse generator 180 (as shown in FIG. 3). In other words, the hold signal HLD is generated in response to the sample signal $S_{MP}$. An input terminal of the inverter 175 is coupled to the output terminal Q of the flip-flop 120 to receive the sample signal $S_{MP}$. An output terminal of the inverter 175 is coupled to an input terminal of the pulse generator 180. The pulse generator 180 generates the hold signal HLD in response to the disable of the sample signal $S_{MP}$.

The sample circuit 100 further comprises a hold circuit including a second switch 161 and a second capacitor 160 for generating the feedback signal $E_{AV}$ in response to the second signal $V_{ST}$. The second switch 161 is coupled between the first capacitor 150 and the second capacitor 160. The hold signal HLD is coupled to control the second switch 161 and transfer the second signal $V_{ST}$ to the second capacitor 160. The second capacitor 160 thus generates the feedback signal $E_{AV}$ when the second switch 161 is turned on by the hold signal HLD.

FIG. 5A shows the signal waveforms for the power converter operated in DCM in accordance with the present invention; it includes the switching signal $S_W$, the signal $V_S$, the blanking signal BLK, the sample signal $S_{MP}$, and the hold signal HLD. The hold signal HLD is generated after the sample signal $S_{MP}$ is disabled. A delay time t is inserted between the falling edge of the sample signal $S_{MP}$ and the rising edge of the hold signal HLD.

FIG. 5B shows the signal waveforms for the power converter operated in CCM; it includes the pulse signal PLS, the switching signal $S_W$, the signal $V_S$, the blanking signal BLK, the sample signal $S_{MP}$ and the hold signal HLD; in which T is the switching period of the switching signal $S_W$; $T_{ON}$ is the on-time of the switching signal $S_W$; $T_P$ is the pulse width of the pulse signal PLS. The maximum sample period of the sample signal $S_{MP}$ is "$T-T_{ON}-T_P$". The pulse width of the hold signal HLD must be shorter than the pulse width of the pulse signal PLS, which the hold signal HLD is ended and the feedback signal $E_{AV}$ will be generated before the start of the next switching cycle.

Figure 6:
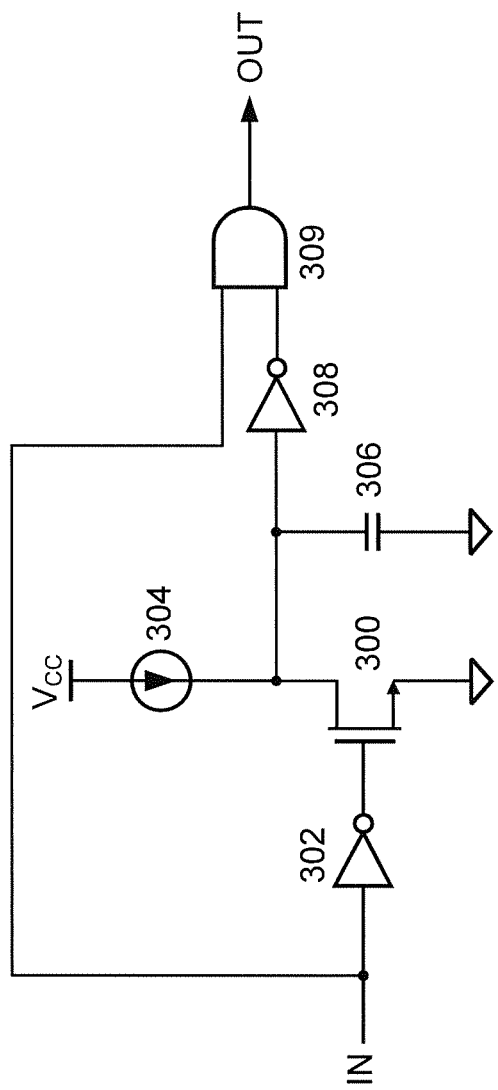
FIG. 6 is a circuit diagram of an embodiment of pulse generators in accordance with the present invention.

FIG. 6 is a circuit diagram of an embodiment of the pulse generators 115 and 180 in accordance with the present invention. The pulse generator comprises a transistor 300, inverters 302, 308, a current source 304, a capacitor 306, and an AND gate 309. The pulse generator receives an input signal IN for generating an output signal OUT. According to the pulse generator 115 (as shown in FIG. 3), the input signal IN is the switching signal $S_W$, and the output signal OUT is the blanking signal BLK. According to the pulse generator 180 (as shown in FIG. 3), the input signal IN is the sample signal $S_{MP}$, and the output signal OUT is the hold signal HLD.

The input signal IN is coupled to a gate of the transistor 300 to drive the transistor 300 through the inverter 302. One terminal of the current source 304 is coupled to the supply voltage $V_{CC}$. The other terminal of the current source 304 is coupled to a drain of the transistor 300 and a terminal of the capacitor 306. A source of the transistor 300 and the other terminal of the capacitor 306 are coupled to the ground. The capacitor 306 is charged by the current source 304 when the level of the input signal IN is a high level and the transistor 300 is turned off. The inverter 308 is coupled between the capacitor 306 and an input terminal of the AND gate 309. The other input terminal of the AND gate 309 is coupled to receive the input signal IN. An output terminal of the AND gate 309 generates the output signal OUT, such as the blanking signal BLK and the hold signal HLD. The amplitude of the current source 304 and the capacitance of the capacitor 306 determine the pulse width of the output signal OUT.

Although the present invention and the advantages thereof have been described in detail, it should be understood that various changes, substitutions, and alternations can be made therein without departing from the spirit and scope of the invention as defined by the appended claims. That is, the discussion included in this invention is intended to serve as a basic description. It should be understood that the specific discussion may not explicitly describe all embodiments possible; many alternatives are implicit. The generic nature of the invention may not fully explained and may not explicitly show that how each feature or element can actually be representative of a broader function or of a great variety of alternative or equivalent elements. Again, these are implicitly included in this disclosure. Neither the description nor the terminology is intended to limit the scope of the claims.

What is claimed is:

1. A sampling circuit for sampling a reflected voltage of a transformer of a power converter, comprising:
    an amplifier circuit coupled to receive the reflected voltage for generating a first signal;
    a first capacitor generating a second signal in response to the reflected voltage;
    a first switch coupled between the reflected voltage and the first capacitor; and
    a sample-signal circuit generating a sample signal in response to the disabling of a switching signal, in which the switching signal is generated in accordance with a feedback signal for regulating an output of the power converter;
    wherein the feedback signal is generated in accordance with the second signal; the sample signal is utilized to control the first switch for sampling the reflected voltage; the sample signal is disabled once the first signal is lower than the second signal; the second signal compared with the first signal has a propagation delay.

2. The circuit as claimed in claim 1, further comprising an oscillator generating a pulse signal coupled to generate the switching signal; in which the sample signal will be disabled in response to the pulse signal.

3. The circuit as claimed in claim 1, further comprising a resistive device coupled to the first switch; in which the resistive device and the first capacitor develop a low pass filter with the propagation delay.

4. The circuit as claimed in claim 3, further comprising a switch coupled to the resistive device to reduce the resistance of the resistive device in response to a blanking time.

5. The circuit as claimed in claim 1, further comprising:
    a second switch coupled to the first capacitor; and
    a second capacitor coupled to the second switch to transform the second signal from the first capacitor to the second capacitor;
    wherein a hold signal is generated in response to the sample signal; the hold signal controls the second switch; the second capacitor generates the feedback signal in response to the second signal.

6. The circuit as claimed in claim 1, wherein the sample signal has a minimum pulse width in response to the disabling of the switching signal.

7. The circuit as claimed in claim 1, wherein the propagation delay is longer than a falling edge slew-rate of the first signal.

8. A sampling circuit of a power converter, comprising:
    an amplifier circuit generating a first signal in response to a reflected voltage of a transformer of the power converter; and
    a sample unit sampling the reflected voltage for generating a second signal in response to the disabling of a switching signal, in which the switching signal is generated in accordance with a feedback signal for regulating an output of the power converter;
    wherein the feedback signal is generated in accordance with the second signal, the sample unit stops sampling the reflected voltage once the first signal is lower than the second signal.

9. The circuit as claimed in claim 8, wherein the sample unit stops sampling the reflected voltage when a pulse signal is enabled, and the pulse signal is utilized to generate the switching signal.

10. The circuit as claimed in claim 8, further comprising a sample-signal circuit generating a sample signal in response to the disabling of the switching signal; the sample signal controlling the sample unit to sample the reflected voltage for generating the second signal.

11. The circuit as claimed in claim 10, wherein the sample signal is disabled when a pulse signal is enabled, and the pulse signal is utilized to generate the switching signal.

12. The circuit as claimed in claim 10, wherein the sample signal is disabled once the first signal is lower than the second signal.

13. The circuit as claimed in claim 8, further comprising a hold circuit coupled to the sample unit to receive the second signal for generating the feedback signal in response to the second signal.

14. The circuit as claimed in claim 8, wherein the sample unit comprises:
    a first capacitor generating the second signal in response to the reflected voltage; and
    a first switch coupled between the reflected voltage and the first capacitor, and being controlled by a sample signal for sampling the reflected voltage.

15. The circuit as claimed in claim 14, further comprising a resistive device coupled to the first switch; in which the resistive device and the first capacitor develop a low pass filter with a propagation delay.

16. The circuit as claimed in claim 15, further comprising a switch coupled to the resistive device to reduce the resistance of the resistive device in response to a blanking time.

17. A sampling circuit of a power converter, comprising:
    a sample unit sampling a reflected voltage of a transformer of the power converter for generating a second signal in response to the disabling of a switching signal, in which the switching signal is generated in accordance with a feedback signal for regulating an output of the power converter;
    wherein the feedback signal is generated in accordance with the second signal, the sample unit stops sampling the reflected voltage when a pulse signal is enabled, and the pulse signal is utilized to generate the switching signal, the sample signal is disabled once the first signal is lower than the second signal.

18. The circuit as claimed in claim 17, further comprising a sample-signal circuit generating a sample signal in response to the disabling of the switching signal; the sample signal controlling the sample unit to sample the reflected voltage for generating the second signal.

19. The circuit as claimed in claim 18, wherein further comprising an amplifier circuit generating a first signal in response to the reflected voltage of the transformer of the power converter.

* * * * *